United States Patent
Kawaura

[11] Patent Number: 6,030,459
[45] Date of Patent: Feb. 29, 2000

[54] LOW-PRESSURE PROCESSING DEVICE

[75] Inventor: Hiroshi Kawaura, Tokyo, Japan

[73] Assignee: C.V. Research Corporation, Tokyo, Japan

[21] Appl. No.: 09/068,048
[22] PCT Filed: Nov. 27, 1996
[86] PCT No.: PCT/JP96/03470
 § 371 Date: Apr. 28, 1998
 § 102(e) Date: Apr. 28, 1998
[87] PCT Pub. No.: WO97/44820
 PCT Pub. Date: Nov. 27, 1997

[30] Foreign Application Priority Data

May 17, 1996 [JP] Japan ................................. 8-146536

[51] Int. Cl.$^7$ .............................. C23C 16/00; C23F 1/02
[52] U.S. Cl. ........................... 118/719; 118/730; 156/345
[58] Field of Search .................................. 118/715, 719, 118/729, 730, 733; 156/345

[56] References Cited

U.S. PATENT DOCUMENTS

| | | | |
|---|---|---|---|
| 4,886,592 | 12/1989 | Anderle et al. | 204/298 |
| 5,154,730 | 10/1992 | Hodos et al. | 29/25.01 |
| 5,156,521 | 10/1992 | Crabb et al. | 414/786 |
| 5,217,501 | 6/1993 | Fuse et al. | 29/25.01 |
| 5,259,942 | 11/1993 | Kempf | 204/298.25 |

Primary Examiner—David Lacey
Assistant Examiner—Drew Becker
Attorney, Agent, or Firm—Flynn, Thiel, Boutell & Tanis, P.C.

[57] ABSTRACT

A semiconductor manufacturing system performs etching, ashing and CVD to form a thin film, using a gas plasma. An apparatus for treatment under a reduced pressure has two treatment chambers (23), a first load-lock chamber (21) connected to the treatment chambers, and second load-lock chambers (22) connected to the first load-lock chamber, the first and second load-lock chambers being set at the same pressure, wherein a disc (19) is disposed in the first load-lock chamber, the disc having a central shaft with four stage units (30) fixed thereto, the stage units permitting substrates to be rested thereon, and by a vertical movement and a rotative conveyance motion such as 180° rotation of the disc there are formed the treatment chambers and the second load-lock chambers simultaneously with the conveyance of the substrates. The formation of the treatment chambers and the second load-lock chambers is effected by moving the disc vertically and thereby providing a seal between an upper cover (24) of the first load-lock chamber and upper covers (25) of the second load-lock chambers and also providing a seal between the upper cover (24) of the first load-lock chamber and upper covers (26) of the treatment chambers.

4 Claims, 5 Drawing Sheets

LOW-PRESSURE PROCESSING DEVICE

TECHNICAL FIELD

The present invention relates to a semiconductor manufacturing system which performs etching, ashing and CVD to form a thin film, using gas plasma. In particular, the invention provides a high throughput apparatus for treatment under a reduced pressure in the semiconductor manufacturing system.

At the same time, according to the present invention, there is provided an apparatus for treatment under a reduced pressure having load-lock chambers and having a high productivity, wherein the conveyance of two or more workpieces (wafers) is performed simultaneously and stably and the temperature of the workpieces is raised or dropped to a preset value until execution of the treatment to increase the throughput.

BACKGROUND ART

A conventional apparatus 01 for treatment under a reduced pressure has a transfer robot 04 within a load-lock chamber 05, the robot 04 having a plurality of handling arms for conveying substrates to treatment chambers 02 and 03, as shown in FIGS. 6 and 7. In the conventional apparatus 01, for improving the productivity, the time required for the conveyance is shortened by increasing the operating speed of the apparatus.

However, the conventional apparatus uses the transfer robot for the conveyance of substrates under a reduced pressure. In this case, if the transfer robot operates in the atmosphere, the substrates are held by a vacuum suction, but under a reduced pressure, the substrates are merely placed on the handling arms, so it is impossible to effect a high-speed operation of the transfer robot. Thus, a limit has so far been encountered in shortening the conveyance time.

Further, in the case where the substrates are placed on cassette stages 07 and 08, which are held under atmospheric pressure, as shown in FIG. 6, it is necessary that the internal pressure of the load-lock chamber 05 with the transfer robot carried therein be returned to atmospheric pressure at every treatment of the two substrates. With the recent tendency to a larger substrate diameter, the load-lock chamber has become larger in volume, so that the time required for purge and evacuation is also a cause of a decrease in throughput. Even if the function of high-speed purge and high-speed evacuation is added to the conventional apparatus, the resulting high-speed current of air will cause displacement of the substrates on the handling arms or any other inconvenience caused by, for example, blowing-up of dust.

FIG. 7 shows an improvement over the above apparatus, in which the substrate cassettes 07 and 08 are accommodated within a load-lock chamber 09. Although the apparatus illustrated in FIG. 7 is advantageous in that the time required for purge and evacuation can be shortened, it involves many inconveniences in its application to an automatic substrate supply and recovery system developed along the recent tendency to factory automation. To meet this point, it is necessary to provide another system for automatic supply and recovery of the substrate cassettes with respect to the load-lock chamber. However, this results in an increase of cost. Further, due to an increase in volume of the cassette load-lock chamber with an increase in substrate diameter, the time required for purge and evacuation for each treatment lot has also come to be a cause of deteriorated productivity.

The present invention eliminates the above-mentioned drawbacks of the prior art and provides an apparatus for treatment under a reduced pressure capable of supplying substrates of a large diameter automatically and conveying them at a high speed and is capable of attaining a high throughput.

DISCLOSURE OF INVENTION

According to the present invention, in a semiconductor manufacturing system which performs etching, ashing and CVD to form a thin film, using a gas plasma, there is provided a high throughput apparatus for treatment under a reduced pressure, having two treatment chambers, a first load-lock chamber connected to the treatment chambers, and second load-lock chambers connected to the first load-lock chamber, the load-lock chambers being set at the same pressure and, in which, a disc is disposed in the first load-lock chamber, the disc having a central shaft with four stage units fixed thereto, the stage units permitting substrates to be rested thereon, and by a vertical movement of the disc and a rotative conveyance motion, say, 180° rotation, of the disc there are formed the treatment chambers and the second load-lock chambers simultaneously with the conveyance of the substrates.

The formation of the treatment chambers and the second load-lock chambers can be done by moving the disc vertically and by providing a seal between an upper cover of the first load-lock chamber and upper covers of the second load-lock chambers and also between the upper cover of the first load-lock chamber and upper covers of the treatment chambers. A purge air inlet is connected to the first load-lock chamber and a nitrogen gas ($N_2$) introducing pipe for purging is connected to each of the second load-lock chambers. Further, the stage units are each provided with a substrate guide formed as an annular projection along the upper outer periphery of a unit body.

BEST MODE FOR CARRYING OUT THE INVENTION

The present invention will be described below in more detail with reference to the accompanying drawings.

Figure 1:
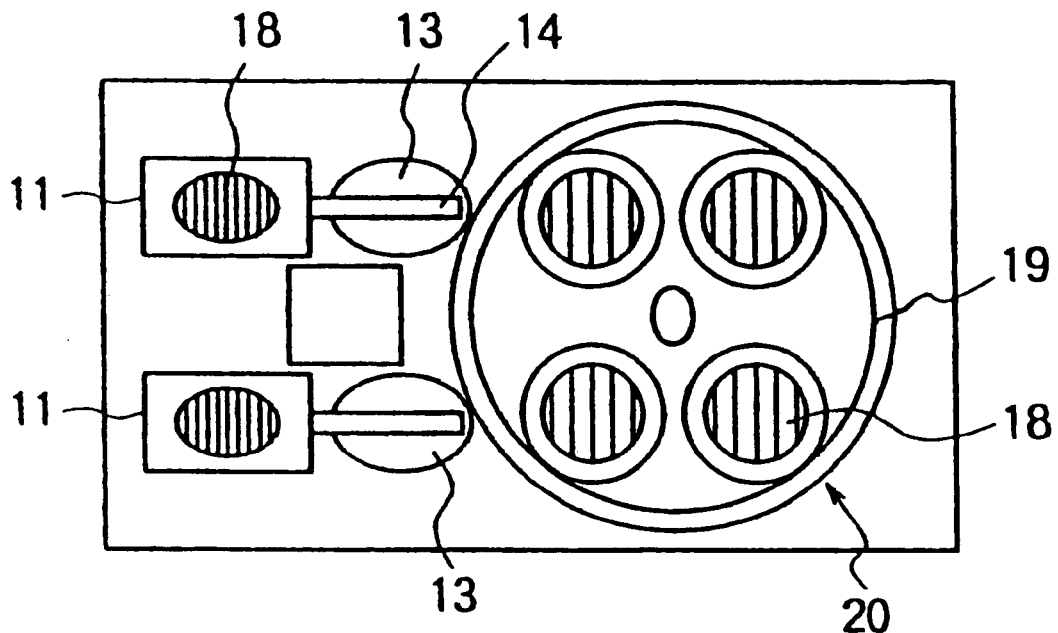
FIG. 1 is a plan view showing schematically a treatment apparatus according to the present invention.
Figure 2:
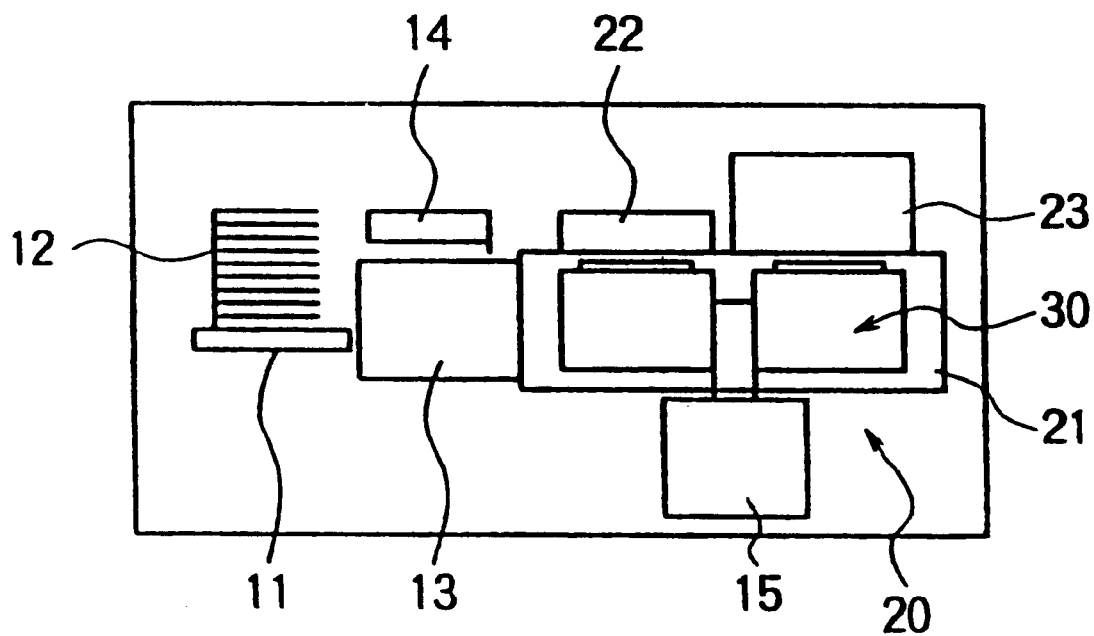
FIG. 2 is a front view thereof.

FIGS. 1 and 2 illustrate a schematic construction of an apparatus for treatment under a reduced pressure according to the present invention, which apparatus comprises right and left cassette stages 11, respective cassettes 12, two transfer robots 13, and a reduced pressure treatment section 20. The details of the section 20 are shown in FIGS. 3 and 4, in which a first load-lock chamber 21 and a disc 19 disposed in the interior of the first load-lock chamber are supported by a drive mechanism 15 through a support shaft 16, the disc 19 being movable vertically and rotatable 180° while supporting four stage units 30.

Figure 3:
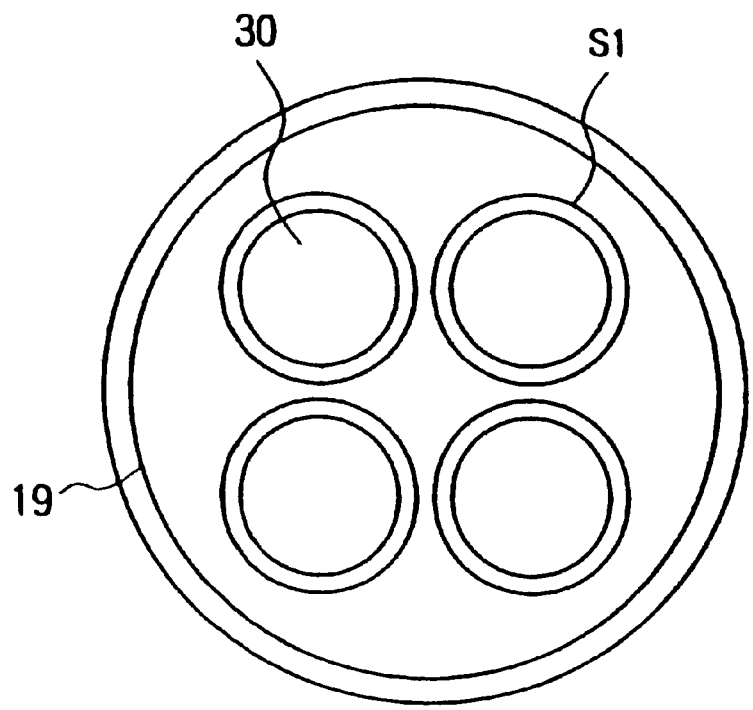
FIG. 3 is a plan view of a reduced pressure treatment section.
Figure 4:
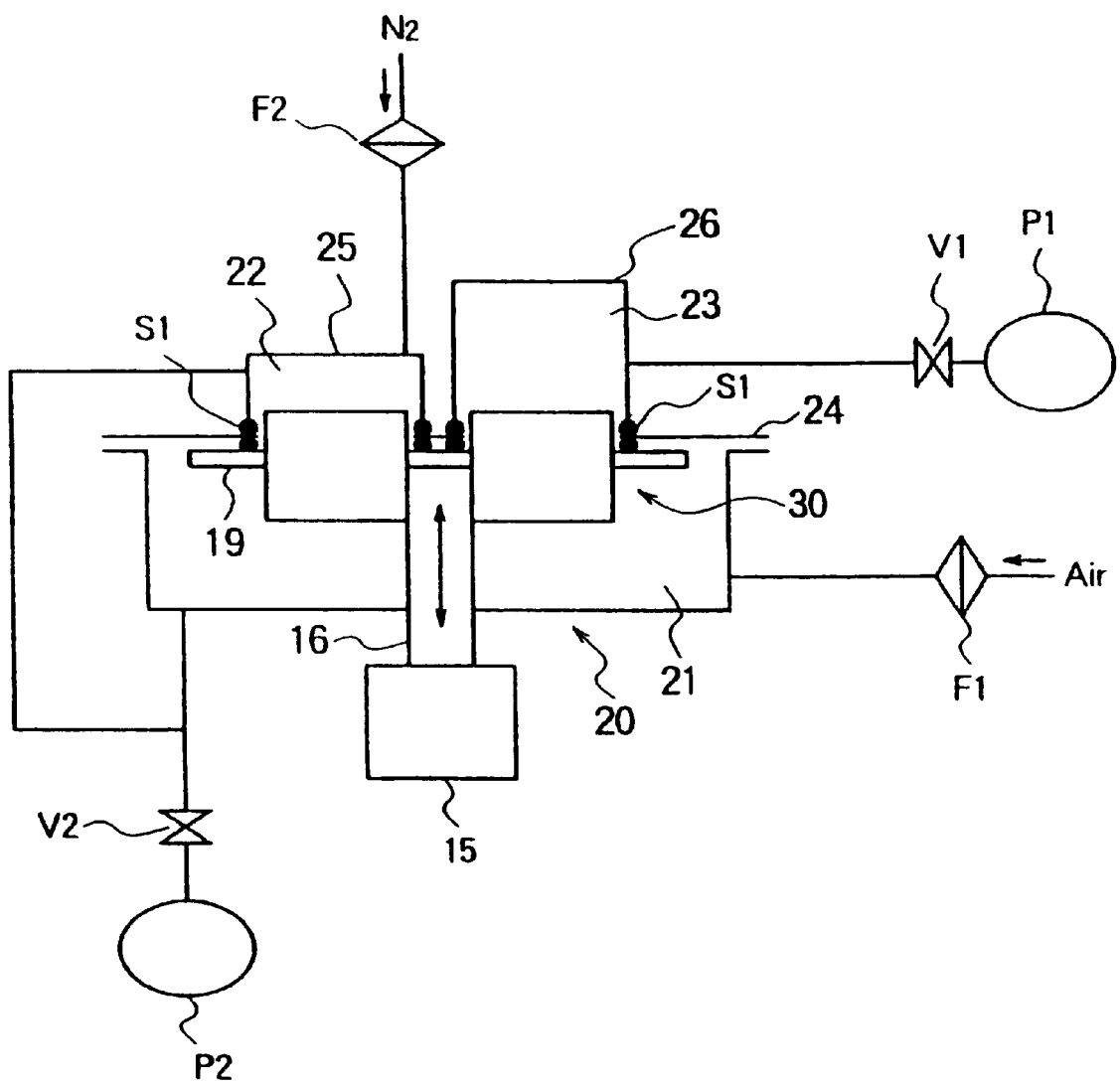
FIG. 4 is a front view thereof.
Figure 6:
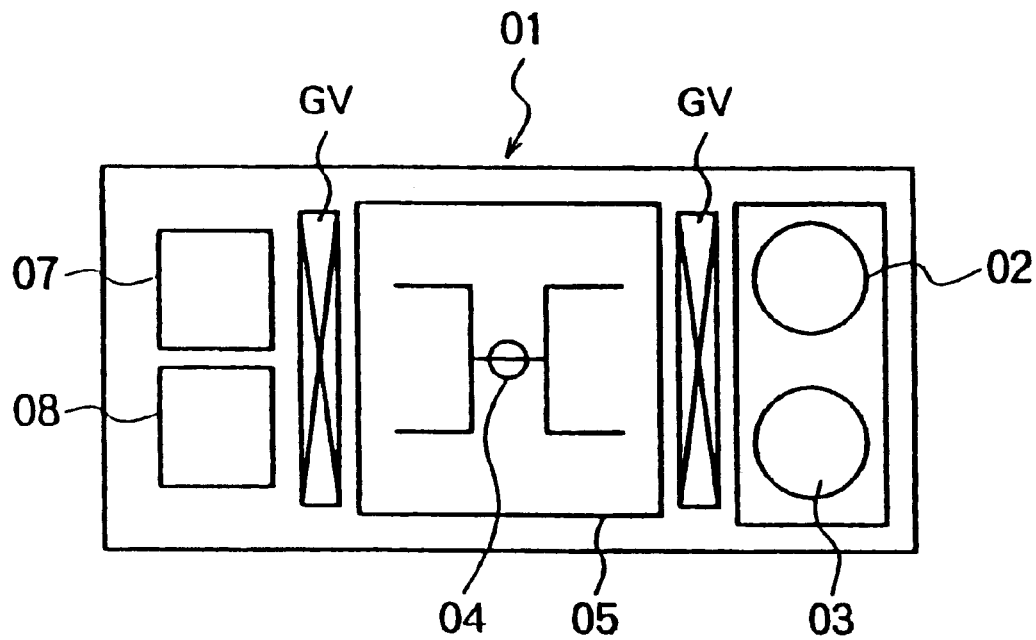
FIG. 6 is a schematic diagram showing an example of a conventional apparatus.
Figure 7:
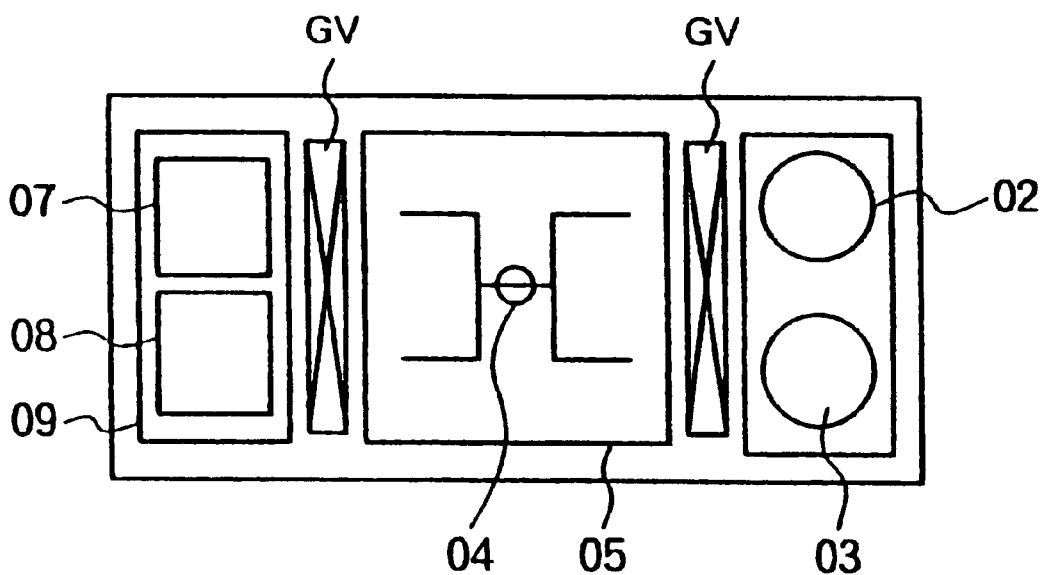
FIG. 7 is a schematic diagram showing another example of a conventional apparatus.

As is seen particularly from FIGS. 3 and 4, the first load-lock chamber 21 has an upper cover 24 and on top of the upper cover 24 are provided upper covers 25 for constituting two second load-lock chambers 22, as well as upper covers 26 for constituting two treatment chambers 23. At positions of the disc 19 supported vertically movably and pivotably by the support shaft 16, which positions are symmetric positions centered on the support shaft 16 and corresponding to the second load-lock chambers 22 and treatment chambers 23, there are provided fourstage units 30. Further, there is provided a sealing member S1 for defining an outer periphery of each stage unit 30. With the sealing member S1, it is possible to provide a seal between the first load-lock chamber 21 and the second load-lock chambers 22 and also between the first load-lock chamber 21 and the treatment chambers 23.

The upper covers 25 and 26 respectively constituting the two second load-lock chambers 22 and two treatment chambers 23 can be sealed to the upper surface of the upper cover 24 of the first load-lock chamber and are capable of being opened and closed.

Further, the treatment chambers 23 and the disc 19 as well as the upper cover 24, are connected in a pressure-reducible manner by means of a pump P1 through a valve V1. Likewise, the second load-lock chambers 22 and the first load-lock chamber 21 are connected in a pressure-reducible manner by means of a pump P2 through a valve V2.

To the first load-lock chamber 21 is connected a purge line capable of introducing air through a filter F1, and to the second load-lock chambers 22 is connected a purge line capable of introducing nitrogen gas ($N_2$) through a filter F2.

Figure 5:
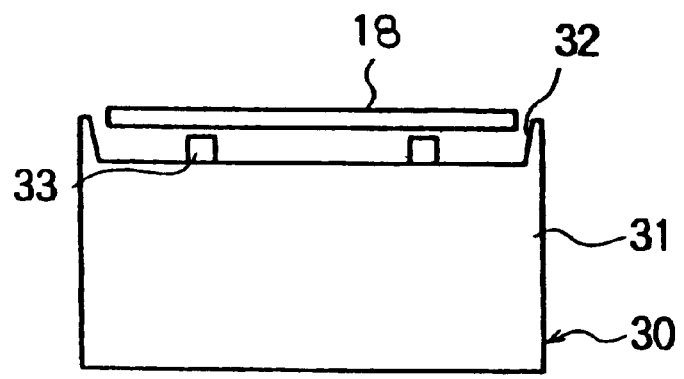
FIG. 5 is a sectional view of a stage unit.

FIG. 5 shows a detailed structure of each of the four stage units 30 illustrated in FIG. 1. A substrate guide 32 is formed as an annular projection on the outer periphery of an upper end face of a stage unit body 31 of each stage unit. On a central upper surface portion of the stage unit body 31 are provided a plurality of pins 33 for supporting a substrate 16 thereon so that the substrate can be conveyed at a high speed under a reduced pressure.

Figure 8A:
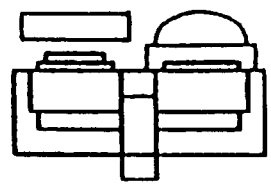
FIGS. 8a–h are a diagram explaining an operation procedure of the treatment section in the present invention.

In FIGS. 1 and 2, the substrates of the cassettes 12 placed respectively on the right and left cassette stages 11 are held in place by vacuum suction with handling arms 14 of the atmospheric transfer robots 13 and are fed simultaneously to the second load-lock chambers 22. At this time, the disc 19 with four stage units 30 fixed thereto is in an upper position as shown in FIG. 8(a), and the treatment chambers are reduced in pressure to a lower level than the pressure for the rotation and pivotal movement of the disc 19. At the same time, the first and second load-lock chambers are equal in pressure to the atmospheric pressure by the presence of air and $N_2$ which have been introduced through the purge lines connected respectively to those chambers.

Now, with reference to FIG. 8, the following description is provided about the operation of the apparatus for treatment under reduced pressure according to the present invention.

First, a check is made to see if the internal pressure of each chamber is at a predetermined level or not, then, if the answer is affirmative, the upper covers 25 of the second load-lock chambers 22 are opened as in FIG. 8(a) and the substrates 18 are set along the substrate guides 32 of stage units 30 as in FIG. 5 by means of the vacuum-chucking handling arms 14 of the transfer robots 13. The stage units 30 are each equipped with a substrate heating or cooling mechanism (not shown), whereby the substrate on each stage unit 30 is heated or cooled to the temperature most suitable for the treatment. It is possible to reach said temperature prior to the completion of the next operation.

Figure 8B:
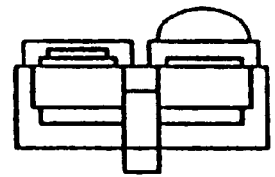
Figure 8C:
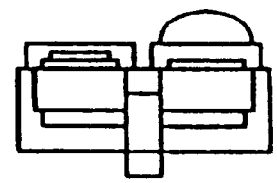
Figure 8D:
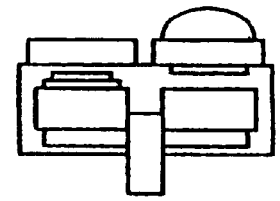
Figure 8E:
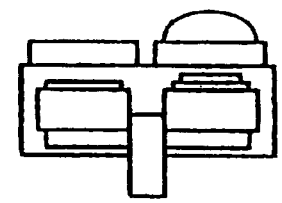
Figure 8F:
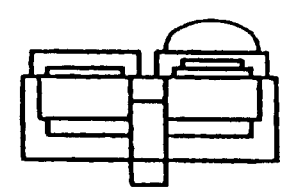
Figure 8G:
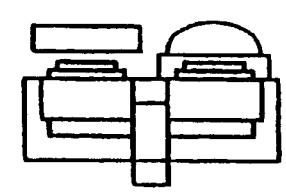

Next, in FIGS. 8(b) and 8(c), the upper covers 25 of the second load-lock chambers 22 are closed, followed by evacuation of the first and second load-lock chambers and purging of the treatment chambers to bring all the pressure chambers into a state of the same reduced pressure. Thereafter, as in FIGS. 8(d) and (e), the disc is brought down and rotated 180° clockwise to feed the substrates 16 to the positions under the treatment chambers 23 together with the stage units 30. Then, in FIG. 8(f), the disc is raised and the treatment chambers are evacuated, followed by a predetermined treatment in the treatment chambers. At this time, in FIG. 8(g), the first and second load-lock chambers are purged with air and $N_2$ to atmospheric pressure simultaneously through separate lines. Subsequently, the upper covers 25 of the second load-lock chambers are opened to receive therein the substrates to be treated next.

At this time, the treatment chambers are in a state of reduced pressure, while the first and second load-lock chambers are in a state of atmospheric pressure, so that the holding force and driving force at the upper position of the stage units are extremely small.

Figure 8H:
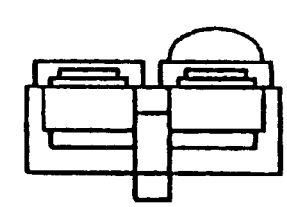

Next, in FIG. 8(h), the first and second load-lock chambers are again evacuated, waiting for completion of the treatment. Upon completion of the treatment all the pressure chambers are brought into a state of reduced pressure and the disc is moved down. Thereafter, as in FIG. 8(e), the disc rotates 180° counterclockwise to feed the treated substrates to the positions under the second load-lock chambers 22 and at the same time feed the substrates to be next treated to the positions under the treatment chambers 23.

The above operations are repeated to continue the treatment.

As explained above in connection with FIG. 4, the first and second load-lock chambers 21, 22 are connected to the same vacuum pump P2 through valve V2, while the exhaust side of the treatment chambers 23 is connected to another vacuum pump P1 through valve V1. In this condition, the above sequence is executed.

INDUSTRIAL APPLICABILITY

According to the apparatus for treatment under a reduced pressure of the present invention, as set forth above, the conveyance of two or more substrates can be done in a simultaneous and stable manner and it is possible to effect the quick rise and fall of temperature with respect to the treatment temperature.

Besides, the use of stage units can realize a high and stable transfer speed for substrates. Further, during treatment of two or more substrates, it is possible to complete the unloading of the treated substrates and the loading of the substrates to be treated next. Thus, the throughput of the apparatus almost depends on the substrate treating time, and the apparatus permits an automatic supply of substrates.

I claim:

1. A semiconductor manufacturing apparatus for performing etching, ashing and chemical vapor deposition to form a thin film on a pair of substrates using a gas plasma under a reduced pressure, said apparatus comprising two treatment chambers provided adjacent one another, a first load-lock chamber connected to said treatment chambers and comprising a purge air inlet, means for introducing purge air to said purge air inlet, two second load-lock chambers connected to the first load-lock chamber and comprising a nitrogen purge inlet, means for introducing nitrogen to said nitrogen purge inlet, a disc having four stage units contained in the first load-lock chamber, a vertically movable and rotatable shaft connected to a bottom surface of said disc for vertically moving said disc, rotating said disc in increments of 180° to define said treatment chambers and said second load-lock chambers and carry said substrates from said second load-lock chambers to said treatment chambers simultaneously and means for controlling the first load-lock chamber and the second load-lock chambers at the same pressure.

2. An apparatus for treatment under reduced pressure according to claim 1, wherein the formation of said treatment chambers and said second load-lock chambers are formed by the vertical movement of said disc which provides a seal between an upper cover of the first load-lock chamber and upper covers of the second load-lock chambers and also provides a seal between the upper cover of the first load-lock chamber and upper covers of the treatment chambers.

3. An apparatus for treatment under reduced pressure according to claim 1, wherein each of said stage units has a unit body with a substrate guide being formed as an annular projection on an upper outer periphery thereof.

4. A semiconductor manufacturing apparatus for performing etching, ashing and chemical vapor deposition to form a thin film on a pair of substrates using a gas plasma under a reduced pressure, said apparatus comprising two treatment chambers, a first load-lock chamber comprising a purge air inlet, means for introducing purge air to said purge air inlet, two second load-lock chambers comprising a nitrogen purge inlet, means for introducing nitrogen to said nitrogen purge inlet, a vertically movable and rotatable disc contained in the first load-lock chamber for moving vertically to define, together with upper covers of the first load-lock chambers, the second load-lock chambers, and the treatment chambers, said treatment chambers and said second load-lock chambers and carrying said substrates from said second load-lock chambers to said treatment chambers simultaneously and means for controlling the first load-lock chamber and the second load-lock chambers at the same pressure.

* * * * *

UNITED STATES PATENT AND TRADEMARK OFFICE
CERTIFICATE OF CORRECTION

PATENT NO  : 6 030 459
DATED      : February 29, 2000
INVENTOR   : Hiroshi KAWAURA It is certified that error appears in the above-identified patent and that said Letters Patent are hereby corrected as shown below:

Column 5, line 12; delete "the formation of".

Column 6, line 1; delete "being".

Signed and Sealed this

Tenth Day of April, 2001

Attest:

NICHOLAS P. GODICI

Attesting Officer

Acting Director of the United States Patent and Trademark Office